United States Patent
Pounds

(10) Patent No.: US 10,490,791 B1
(45) Date of Patent: Nov. 26, 2019

(54) CONTAINER VENTING SYSTEM

(71) Applicant: Olaeris, Inc, Fort Worth, TX (US)

(72) Inventor: Paul E. I. Pounds, Brisbane (AU)

(73) Assignee: Olaeris, Inc., Burleson, TX (US)

( * ) Notice: Subject to any disclaimer, the term of this patent is extended or adjusted under 35 U.S.C. 154(b) by 219 days.

(21) Appl. No.: 15/722,992

(22) Filed: Oct. 2, 2017

Related U.S. Application Data

(63) Continuation of application No. 14/671,202, filed on Mar. 27, 2015, now Pat. No. 9,806,310.

(60) Provisional application No. 61/975,378, filed on Apr. 4, 2014.

(51) Int. Cl.
*B64D 45/00* (2006.01)
*H01M 2/12* (2006.01)

(52) U.S. Cl.
CPC .......... *H01M 2/1235* (2013.01); *B64D 45/00* (2013.01); *B64D 2045/009* (2013.01); *H01M 2/12* (2013.01); *H01M 2/1205* (2013.01); *H01M 2/1211* (2013.01); *H01M 2/1229* (2013.01); *H01M 2220/20* (2013.01)

(58) Field of Classification Search
CPC ........... H01M 10/4285; H01M 10/482; H01M 10/486; H01M 10/613; H01M 10/625; H01M 10/658; H01M 2200/10; H01M 2200/103; H01M 2220/20; H01M 2/1077; H01M 2/1235; H01M 2/1282; H01M 2/34; H01M 2/348

See application file for complete search history.

(56) References Cited

U.S. PATENT DOCUMENTS

| | | | |
|---|---|---|---|
| 7,547,498 B2 | 6/2009 | Smith et al. |
| 2003/0232236 A1 | 12/2003 | Mitchel et al. |
| 2004/0043286 A1 | 3/2004 | Janmey |
| 2008/0097704 A1 | 4/2008 | Notten et al. |
| 2010/0068607 A1 | 3/2010 | Spare et al. |

(Continued)

FOREIGN PATENT DOCUMENTS

DE  WO2013171003 A1  11/2013

OTHER PUBLICATIONS

"Final Office Action Issued in U.S Appl. No. 14/671,202", dated Aug. 10, 2017, 9 Pages.

(Continued)

*Primary Examiner* — Stewart A Fraser
*Assistant Examiner* — Rachel L Zhang
(74) *Attorney, Agent, or Firm* — Michael B. Dodd

(57) ABSTRACT

The present invention extends to a container venting system. A wall portion of a container includes a (e.g., thermo-sensitive) panel. Any portion of the panel exposed to sufficient heat crumbles or ruptures (e.g., without burning) creating an opening in the wall portion. In one aspect, a container is included in a vehicle (e.g., an Unmanned Aerial Vehicle (UAV)). The container includes a panel in an external wall of the vehicle. Any portion of the panel exposed to sufficient heat crumbles to create an opening in the external wall of the vehicle. A container can be a sealed container with the panel sealed to the wall portion or to the external wall of the vehicle. The interior of the sealed container can contain a battery cell. Creating an opening allows gases to vent out of the sealed container and/or to vent outside of the vehicle.

22 Claims, 3 Drawing Sheets

(56) References Cited

U.S. PATENT DOCUMENTS

| | | | |
|---|---|---|---|
| 2011/0256433 A1* | 10/2011 | Fuhr | H01M 2/1229 |
| | | | 429/82 |
| 2012/0058377 A1* | 3/2012 | Sastry | H01M 2/1077 |
| | | | 429/94 |
| 2012/0114994 A1 | 5/2012 | Kurahashi | |
| 2013/0089765 A1 | 4/2013 | Murayama et al. | |
| 2013/0095353 A1 | 4/2013 | Li | |
| 2013/0149583 A1 | 6/2013 | Kurita | |
| 2014/0170446 A1 | 6/2014 | Elian et al. | |
| 2014/0287278 A1 | 9/2014 | Despesse | |
| 2015/0132621 A1 | 5/2015 | Henrici | |

OTHER PUBLICATIONS

"Advisory Action Issued in U.S Appl. No. 14/671,202", dated Aug. 24, 2017, 4 Pages.

"Notice of Allowance Issued in U.S Appl. No. 14/671,202", dated Sep. 21, 2017, 8 Pages.

"Final Office Action Issued in U.S Appl. No. 14/671,160", dated Dec. 12, 2017, 10 Pages.

"Non-Final Office Action Issued in U.S Appl. No. 14/671,202", dated Mar. 9, 2017, 10 Pages.

"Non-Final Office Action Issued in U.S Appl. No. 14/671,160", dated Jun. 29, 2017, 6 Pages.

"Final Office Action Issued in U.S Appl. No. 14/671,160", dated Aug. 10, 2017, 9 Pages.

"Advisory Action Issued in U.S Appl. No. 14/671,160", dated Aug. 24, 2017, 4 Pages.

"Notice of Allowance Issued in U.S Appl. No. 14/671,160", dated Sep. 21, 2017, 9 Pages.

\* cited by examiner

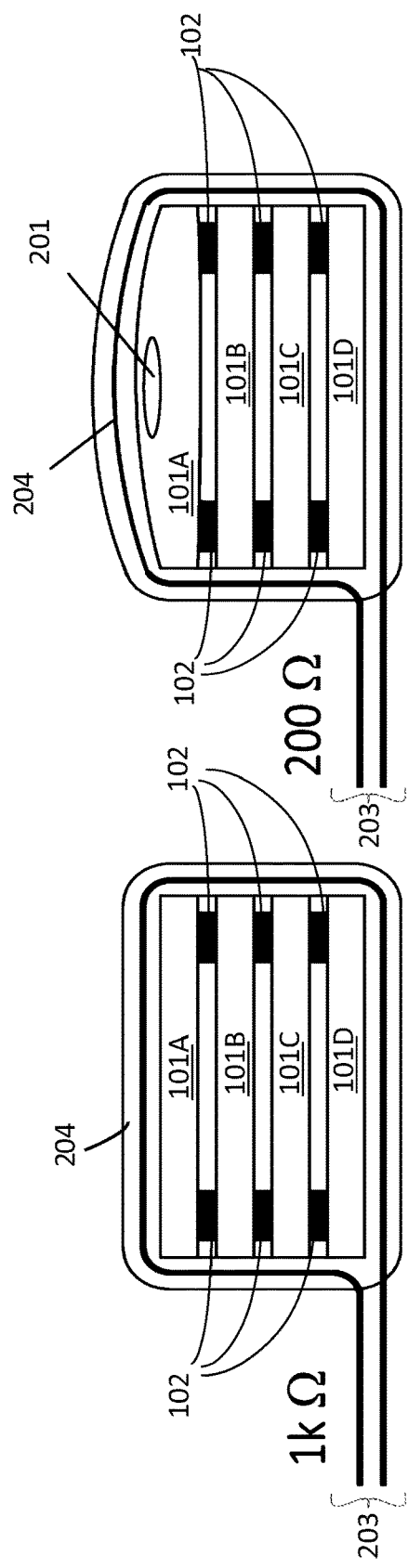
FIG. 2A
FIG. 2B
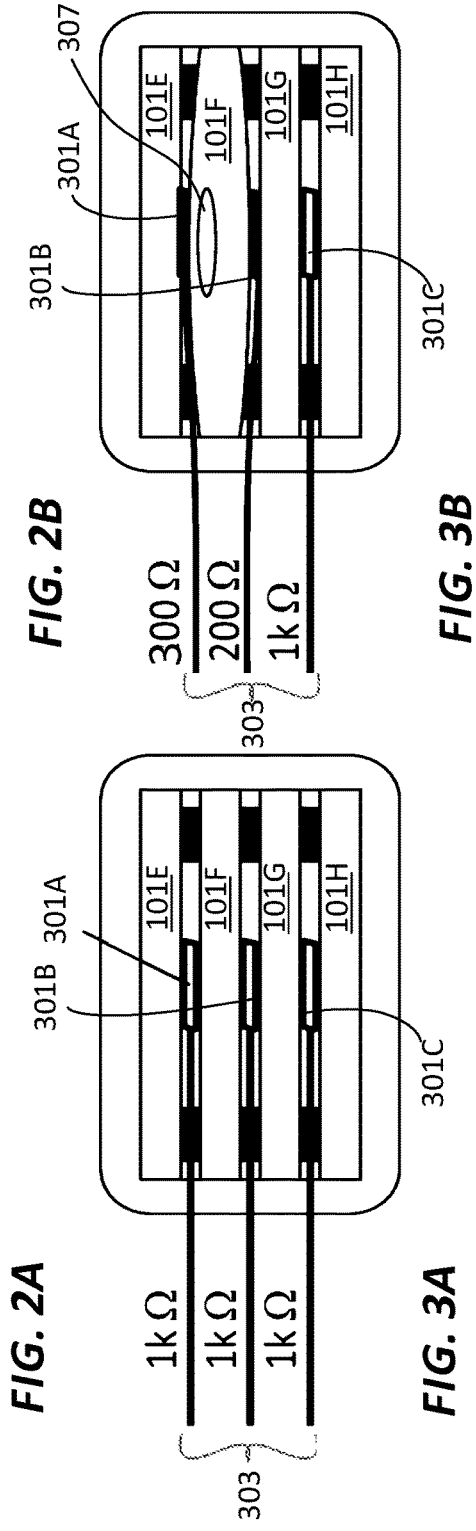
FIG. 3A
FIG. 3B

CONTAINER VENTING SYSTEM

CROSS-REFERENCE TO RELATED APPLICATIONS

This application is a continuation of and claims the benefit of and priority to U.S. patent application Ser. No. 14/671,202, entitled "Battery Failure Venting System", filed Mar. 27, 2015 by Paul E. I. Pounds, the entire contents of which are expressly incorporated by reference. That application claims the benefit of and priority to U.S. Provisional Patent Application Ser. No. 61/975,378 entitled "Battery Status and Failure Detector And Battery Failure Venting System", filed Apr. 4, 2014 by Paul E. I. Pounds, the entire contents of which are expressly incorporated by reference.

BACKGROUND

Background and Relevant Art

Battery condition monitors typically use electronic means to determine battery condition. For example, a battery condition monitor can be configured to sense abnormal electrical charge status. Abnormal electrical charge status can indicate that conductive charge-storing elements inside the battery have failed. Unfortunately, prior to a battery being discharged in operation, typical battery condition monitors are unable to distinguish between an overcharged battery with internal failure and a battery that is operating normally. Requiring a battery to be in operation to identify an overcharge condition is dangerous for a variety of reasons. For example, when operating, a battery with an overcharge condition can be strongly discharged, leading to off-gassing of hydrogen, overheating or fire.

Battery fires in vehicles (e.g., aircraft) are a major risk where high-energy density volatile battery chemistries are used. Fire suppression systems used in larger vehicles may not be appropriate for smaller vehicles. For example, fire suppression systems (e.g., engine bottles, compressed gas or foam) used in large scale aircraft are not appropriate to smaller aircraft, which cannot afford the mass overhead. Battery fires are especially problematic in vehicles (e.g., aircraft) where large numbers of volatile batteries are stored in close proximity. Failure of a single battery may result in release of hot combustion gasses into a battery compartment, leading to combustion of multiple, and potentially all of the, batteries in the battery compartment. Combustion of a sufficient number of batteries can be lead to vehicle (e.g., aircraft) loss.

BRIEF SUMMARY

The present invention extends to a container venting system. A wall portion of a container includes a (e.g., thermo-sensitive) panel. Any portion of the panel exposed to sufficient heat crumbles or ruptures (e.g., without burning) creating an opening in the wall portion. A container can be a sealed container with the panel sealed to the wall portion. A battery cell can be contained in the interior of the sealed container. Creating an opening in the wall portion allows gases to vent out of the interior of the sealed container.

In one aspect, a container is included in a vehicle (e.g., an Unmanned Aerial Vehicle (UAV)). The container includes a panel in an external wall of the vehicle. Any portion of the panel exposed to sufficient heat crumbles to create an opening in the external wall of the vehicle. The container can be a sealed container with the panel sealed to the external wall of the vehicle. A battery cell can be contained in the interior of the sealed container. Creating an opening in the wall portion allows gases in the interior of the sealed container to vent outside of the vehicle.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

The specific features, aspects and advantages of the present invention will become better understood with regard to the following description and accompanying drawings where:

FIGS. 2A and 2B illustrate an example of detecting battery cell failure.

FIGS. 3A and 3B illustrate another example of detecting battery cell failure.

DETAILED DESCRIPTION

Figure 1:
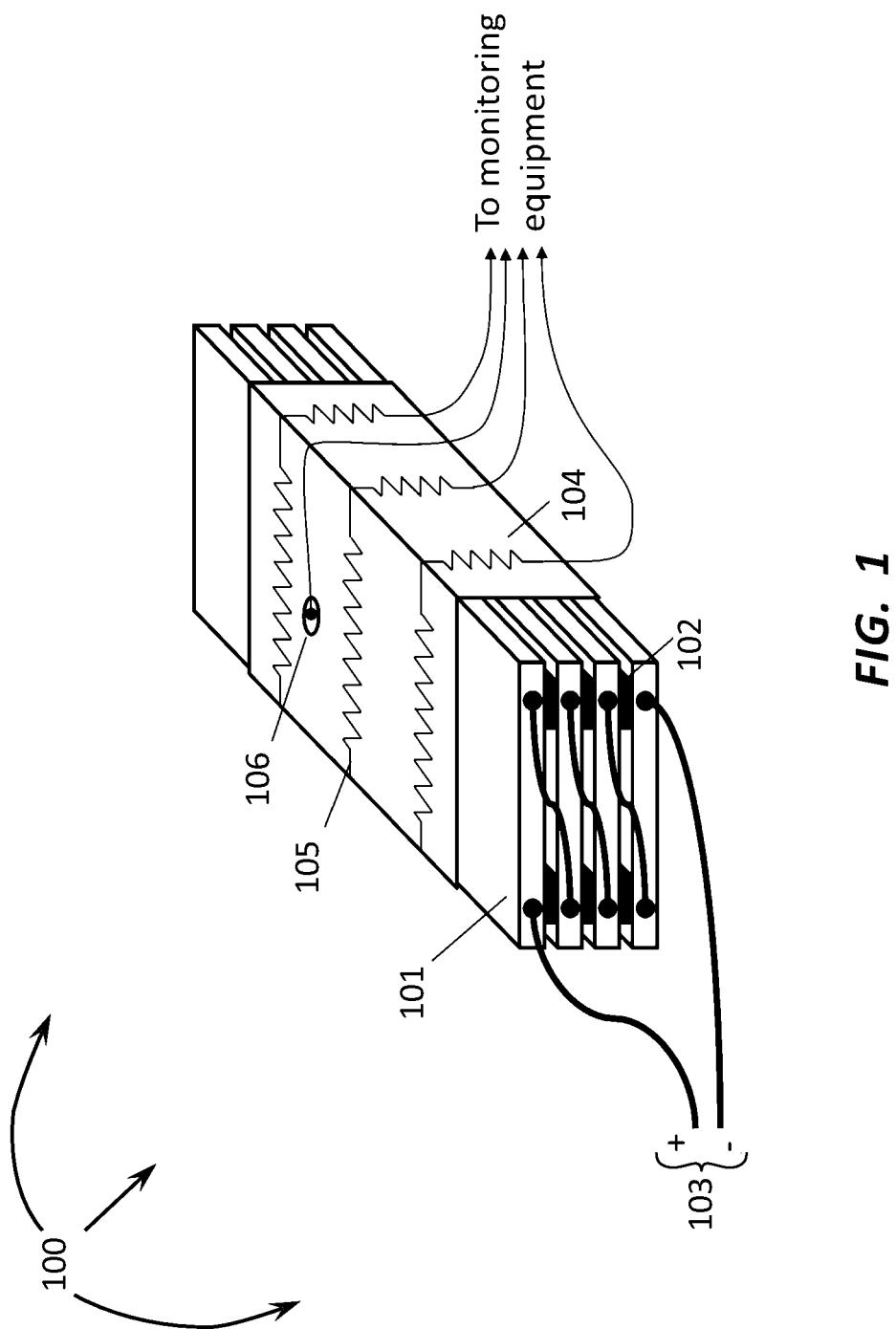
FIG. 1 illustrates an example battery cell array.

The present invention extends to methods, systems, devices, apparatus, and computer program products for protecting against runaway thermal failure of a battery pack. An arrangement of batteries is housed in a thermally shielded compartment. The thermally shielded compartment includes a heat sensitive but non-burning exterior panel. Heat buildup within the compartment cause the exterior panel to thermally react in a manner that creates an exhaust opening without burning. As such, a power system can continue operation without risk of internal fire propagation.

Embodiments of the invention include a passive device for (potentially automatically) venting flames, hot gases, and combustion products from within a container for batteries. A container or network of containers (with adjoining edges or entirely separate) isolates batteries or sets of batteries from one another other. Thermo-sensitive panel covers seal one or more vent ports (i.e., openings) of each container from outside environment.

Containers can be constructed to be fireproof or fire resistant. Containers may include fire proofing or fire retardant treatments or coatings, thermal insulation, isolation or cooling panels, divider, bulkheads or structural members, or any combination of these treatments, coatings, systems and elements. Containers can include one or more vent ports.

Similarly, the thermo-sensitive panel covers can be fabricated out of a polymer or natural fiber material that either does not burn, or is treated such that it does not burn. Instead, when battery failure causes temperatures to rise inside one of the compartments, the panel cover material reacts, causing it to undergo a mechanical structural change, such as, for example, splitting, crumbling or rupturing or otherwise degrading. The structural change opens the sealed contained to the outside allowing hot gasses to vent and preventing the buildup of heat within a container.

Thermo-sensitive panel covers can be constructed from a variety of different materials including, but not limited to: nylon, polyolefin, fluoropolymer, PVC, neoprene, silicone elastomer, Viton and other such "heat shrink" materials, celluloid, and cellulose laminate. In some embodiments, constructed thermo-sensitive panel covers are coated with a fire retardant substance, sealed against moisture, protected from UV radiation or any combination of these, using sprayed, laminated or painted coatings.

A thermo-sensitive panel cover can be arranged to cover each of one or more vent ports of a sealed container.

In some embodiments, containers are arranged so that the unsealed edges or vent ports of batteries, battery cells, or battery packs are oriented to align with the thermo-sensitive panel cover (i.e., the port) side of the container.

Sensors can detect thermal failure and/or panel cover activation and can inform ancillary electronics modules, such as, an avionics system, of the thermal and/or container panel status. In some embodiments, sensors include an electrical link across a port portion of a thermo-sensitive panel cover. A heat related mechanical structural change at thermo-sensitive panel cover causes the link to sever indicating thermal failure. The electrical link can be fusible or frangible.

The ancillary electronics modules can include (potentially automated) electrical isolations systems to isolate a failed battery or failed batteries from other batteries or other banks of batteries. Isolation systems can be implementing using a mechanical switch, relay, solidstate switch, fuse, or other electrical isolation device.

Embodiments of the invention can be implemented in vehicles, structures or other assemblies. Vehicles include land based, aerial, marine based, and space based manned or unmanned vehicles. For example, a vehicle can be a Remotely Piloted Aircraft (RPA) (or other remotely piloted vehicle), such as, an Unnamed Aerial Vehicle (UAV).

In some embodiments, mechanical structural changes to thermo-sensitive panel covers cause a battery compartment to vent outside of a vehicle. For example, in an aircraft, a firewalled battery compartment can include an indeflagrable thermo-sensitive material covering that opens to the outside of the aircraft. Thus, during flight, flames, hot gases, and other combustible material can be vented out of the aircraft.

Figure 4:
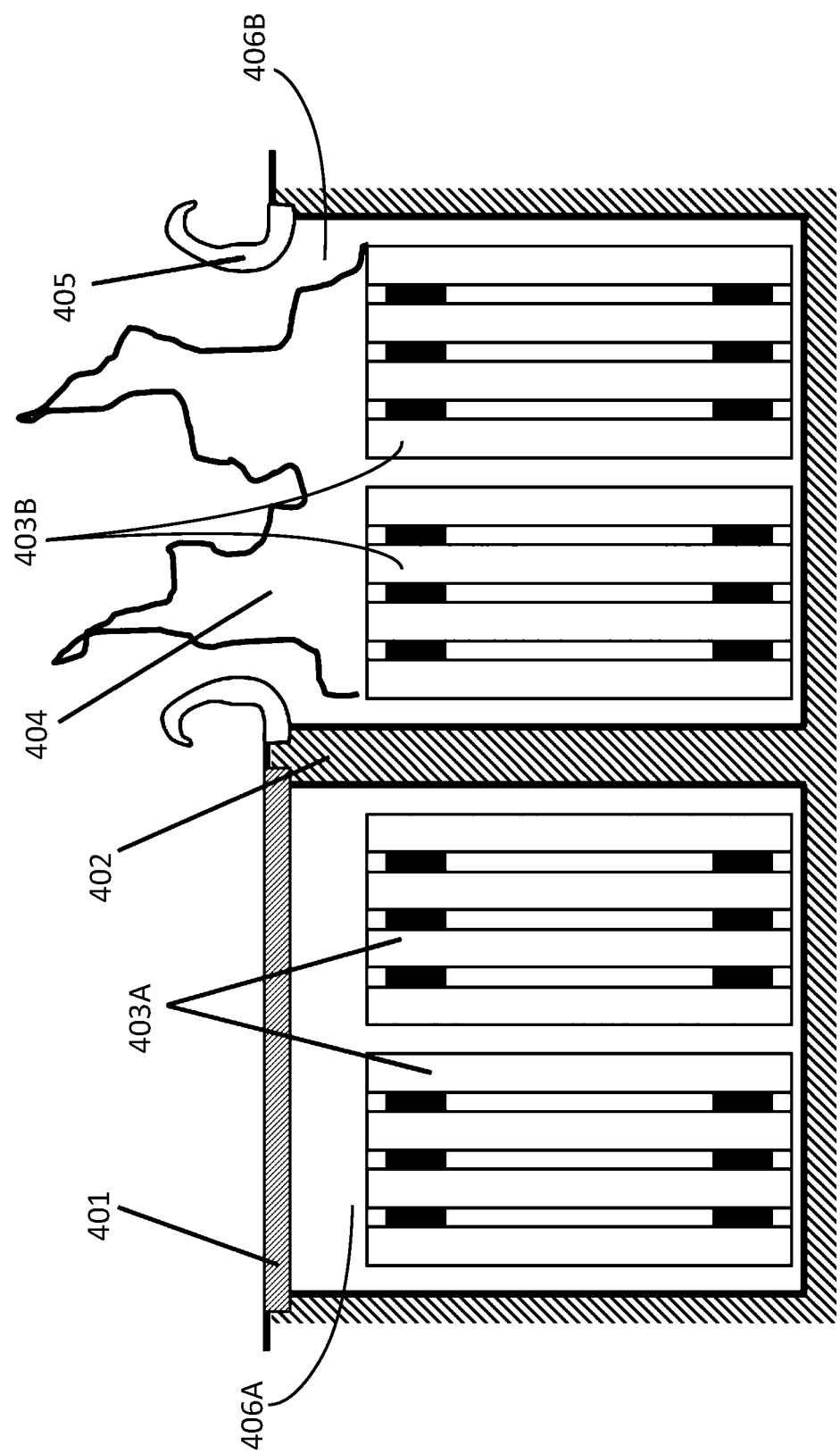
FIG. 4 illustrates battery cell arrays in sealed containers with thermo-sensitive panel covers.

Turning initially to FIG. 4, FIG. 4 illustrates an arrangement of sealed containers with thermo-sensitive panel covers. As depicted, FIG. 4 includes adjoining thermally insulated containers 406A and 406B constructed of fireproof material 402. Container 406A contains one or more volatile cells, batteries or battery packs 403A and includes thermo-sensitive panel cover 401. Container 406B contains one or more volatile cells, batteries or battery packs 403B and includes thermo-sensitive panel cover 405.

As depicted, one or more cells, batteries or battery packs 403B have failed causing possible ignition and flames and hot gases 404 to be released. In response, thermo-sensitive panel cover 405 has ruptured permitting gasses to be vented to the outside, allowing the energy to escape, reducing the temperature inside, and limiting the loss of cells to those contained within container 406B. Thus, thermo-sensitive panel covers can be used to mitigate or eliminate the chance of dangerous thermal events escalating to more dangerous events (e.g., catching a vehicle on fire).

Analog and/or digital systems can be used to monitor thermal failure detection. In some embodiments, analog and/or digital monitoring systems can also implement remediating measures to electrically isolate or disconnect a battery cell or battery pack from other components. For example, a monitoring system could activate a switch or relay to open a circuit connected to a battery cell or battery pack.

Monitoring equipment can be co-located with and/or separate from thermal failure sensors. In some embodiments, monitoring equipment is distributed across different physical locations. For example, some monitoring equipment can be co-located with sensors (e.g., in a vehicle) and other monitoring equipment can be more remotely located. Thermal failure sensor leads can be connected to co-located components. Signals from thermal failure sensors are transmitted to and received at the co-located components (which may be able to take some remediating measures). The co-located components can then relay the signals (or other representative or derived signals) to other more remote systems (e.g., in a control or command center that monitors battery pack arrays in a number of different locations). The signals can be relayed over wired and/or wireless communication networks.

For example, systems of a land based, aerial, marine based, or space based manned or unmanned vehicle can be powered by a battery pack cell array. Some monitoring equipment for monitoring thermal failure can be included within and/or at the vehicle. For example, a sealed battery pack container (containing one or more batteries, battery cells, or battery packs) with thermo-sensitive panel cover and corresponding monitoring equipment can be mounted to the vehicle.

Embodiments of the invention can be used in combination with methods, systems, devices, apparatus, and computer program products for detecting battery status and battery failure. In general, detecting swelling of a battery cell along with optional measurement of temperature increases can be used to identify a battery cell as failing or failed. Mechanical strain sensors can be used to detect battery cell swelling during operation or charging. For example, an array of strain sensors including an instrumented sleeve can be fit over (e.g., lithium polymer) batteries to detect mechanical swelling of the batteries. In some embodiments, mechanical strain sensors are used along with temperature probes to detect battery cell failure. The temperature probes can supplement findings of strain sensors with temperature measurements.

Thus, embodiments of the invention include a sensing sleeve and/or sensor apparatus for detecting the failure of battery cells during charging or operation. The sensing sleeve encircles battery cells, for example, lengthwise or cross-wise. The sensing sleeve contains, mounts, or is co-located with one or more sensors. The one or more sensors can include linear force sense resistors, strain gauges, or other extension measuring sensors. As such, sensors associated with a sensing sleeve and/or sensor apparatus can detect an increase in the circumference of the sensing sleeve or sensor apparatus (indicative of a possible cell failure). The increased circumference can be measured as a change in sensor output. The change in sensor output can registered with monitoring circuitry or equipment.

A sensing sleeve or sensor apparatus can be constructed from many different combinations of materials. The different combinations of materials can have various levels of rigidity varying from stiff to highly elastic. The sleeve can be constructed of fire resistant material to resist, contain or channel flames in the result of ignition of the cells or contained gas.

Other sensors can be arranged inside a battery pack cell array. For example, one or more of compression force sense resistors, strain gauges or other compression measuring devices can arranged between adjacent cells within a battery pack cell array. As such, sensors inside the battery pack cell array (e.g., contiguous compression sensors) can register increased pressure (indicative of a possible cell failure). The increased pressure can be measured as a change in sensor output. The change in sensor output can registered with monitoring circuitry or equipment.

Sensors inside a battery cell array can be positioned such that airflow can penetrate the cell array and cool the battery pack.

In this way, a faulty cell can potentially be identified prior to occurrence of a dangerous event such as fire or explosion. When a faulty cell is identified, remediating actions, including any of: isolating, disconnecting, or removing the faulty cell can be performed. As such, the threat of a dangerous event is reduced, and potentially eliminated. In the event remediating actions fail and a dangerous event (e.g., a fire) does occur, gases can be vented to reduce the destructive impact of the dangerous event.

Turning to FIG. 1, FIG. 1 depicts battery cell array 100. Battery cell array 100 includes an array of battery cells 101 stacked with spacers 102. Battery leads 103 connect battery cells 101 to one another as well as connecting battery cell array 100 to other components (e.g., that are being powered by battery cell array 100).

Battery cell array 100 is wrapped in (possibly fire-resistant) sleeve 104. A number of sensors 105 are embedded in sleeve 104. Sensors 105 can be configured to detect external swelling battery cell array 100. Sensors 105 can be or include force strain restive sensors, linear force sense resistors, strain gauges, or other extension measuring sensors. Leads from sensors 105 connect back to monitoring circuitry and/or equipment.

One or more temperature probes 106 can also be embedded in sleeve 104 and/or between cells 101. Leads from any temperature probes 106 can also connect back to monitoring circuitry and/or equipment.

Additional sensors can also be arranged internally between cells 101 to detect swelling of individual cells 101. Leads from internal sensors can also connect back to monitoring circuitry and/or equipment.

FIGS. 2A and 2B illustrate an example of detecting battery cell failure. FIG. 2A depicts (e.g., circumferential) sleeve 204 around a battery array including cells 101A, 101B, 101C, and 101D that are separated by spacers 102. In FIG. 2A, the battery array can be operating within specified (e.g., normal) operating conditions for the battery array. As such, force sensors in sleeve 204 can measure a nominal resistive value, for example, of 1 kΩ Leads 203 can be connected back to monitoring circuitry and/or equipment.

In FIG. 2B, failure of cell 101A causes cell 101A to swell and release hydrogen gas bubble 201. Swelling and hydrogen gas bubble 201 causes sleeve 204 to stretch. The stretching of sleeve 204 can reduce or increase the resistance measured by force sensors on sleeve 204, for example, to 200Ω. Via leads 203 monitoring circuitry and/or equipment can detect the change and issue a warning.

FIGS. 3A and 3B illustrate another example of detecting battery cell failure. FIG. 3A depicts a battery array including cells 101E, 101F, 101G, and 101H that are separated by spacers 102 (not labeled). In FIG. 3A, sensors 301 are included lengthwise between cells of the battery array. For example, sensor 301A is between cells 101E and 101F, sensor 301B is between cells 101F and 101G, and sensors 301C is between cells 101G and 101H. Sensors 301 are arranged to permit sufficient airflow between cells 101E, 101F, 101G, and 101H for cooling. In FIG. 3A, the battery array can be operating within specified (e.g., normal) operating conditions for the battery array. As such, each of sensors 301 can measure a nominal resistive value, for example, of 1 kΩ. Leads 303 can be connected back to monitoring circuitry and/or equipment.

In FIG. 3B, failure of cell 101F causes cell 101F to swell and/or release hydrogen gas bubble 307. The swelling of cell 101F compresses sensors 301A and 301B. Compression of sensors 301A and 301B can reduce or increase the resistance measured sensors 301A and 301B, for example, to 300Ω and 200Ω. Via leads 303 monitoring circuitry and/or equipment can detect the change and issue a warning. Thus, internal sensors can be used to help identify an individual failing cell.

Embodiments depicted in FIGS. 2A and 2B and FIGS. 3A and 3B can be used together. That is, an external sleeve can be used in combination with internal sensors. Embodiments in FIGS. 2A and 2B and FIGS. 3A and 3B can also be contained in thermally insulated containers (e.g., 406A and 406B) constructed of fireproof material 402

Thermal sensors (not shown) may be co-located with or separate from sensors in sleeve 204 and/or from sensors internally within a battery pack cell array.

Embodiments of the invention can implemented in vehicles, structures or other assemblies. Vehicles include land based, aerial, marine based, and space based manned or unmanned vehicles.

Analog and/or digital systems can be used to monitor battery pack sensors. In some embodiments, analog and/or digital monitoring systems can also implement remediating measures to electrically isolate or disconnect a battery cell or battery pack from other components. For example, a monitoring system could activate a switch or relay to open a circuit connected to a battery cell or battery pack.

Monitoring equipment can be co-located with and/or separate from a sensing sleeve and/or internal sensors. In some embodiments, monitoring equipment is distributed across different physical locations. For example, some monitoring equipment can be co-located with sensors (e.g., in a vehicle) and other monitoring equipment can be more remotely located. Sensor leads can be connected to co-located components. Signals from the sensors are transmitted to and received at the co-located components (which may be able to take some remediating measures). The co-located components can then relay the signals (or other representative or derived signals) to other more remote systems (e.g., in a control or command center that monitors battery pack arrays in a number of different locations). The signals can be relayed over wired and/or wireless communication networks.

For example, systems of a land based, aerial, marine based, or space based manned or unmanned vehicle can be powered by a battery pack cell array. Some monitoring equipment for monitoring the battery pack can be included within and/or at the vehicle. For example, the battery pack and monitoring equipment can be mounted to the vehicle.

Accordingly, some or all of different embodiments of the invention can be used and/or integrated to together to provide layered protection against dangerous battery related conditions and events. For example, components of a battery status and failure indicator and components of a battery failure venting system can be combined to provide layered protection against dangerous battery related conditions and events. A battery status and failure indicator can potentially detect and remediate a battery failure before a dangerous condition or event occurs. If a dangerous event or condition nonetheless occurs, a battery failure venting system can detect the dangerous event or condition and mitigate any resulting damage (e.g., containing damage to an individual sealed container).

For example, a sensing sleeve can be fit over batteries, battery cells, or battery packs contained in a sealed container and/or sensors arranged between battery cells within a sealed container. Sensors in the sleeve and/or the internally arranged sensors can be used to detect failed or failure batteries, battery cells, or battery packs. As described, the sealed container can include one or more vent ports and the one or more vent ports can be covered with thermo-sensitive panel covers.

Leads for the sensors can be covered in fire proof or fire retardant insulation. The leads can be run out of a sealed container through an additional opening. The additional opening can be arranged so that unsealed edges or vent ports of batteries, battery cells, or battery packs are oriented away from the additional opening. Fire proof or fire retardant material (as described) can be applied to (e.g., spayed into) the opening to close the opening around the leads, thereby preventing heat and gases from escaping is a dangerous condition or event occurs. As described, the leads can be run to a monitoring system or monitoring equipment (e.g., a controlling avionics system).

Outside the sealed container, leads from a sensing sleeve and/or leads from internally arranged sensors can be combined with leads from a thermal failure detection sensor and/or an electrical isolation component associated with thermo-sensitive panel covers. In some embodiments, all of the leads can run to the same monitoring system or monitoring equipment (e.g., a controlling avionics system). As such, any of these sensors can indicate a condition for isolating or disconnecting batteries and can initiate appropriate remediation.

In general, vehicles can include computer network connectivity components (e.g., a Network Interface Card ("NIC") or cellular modem) for wired or wirelessly connecting the monitoring equipment to a computer network. As such, modules, algorithms, components, etc., for monitoring and remediating thermal failures and for monitoring and remediating battery cell failures at a vehicle can also be connected to other modules, algorithms, components, etc., over (or be part of) a network, such as, for example, a Local Area Network ("LAN"), a Wide Area Network ("WAN"), and even the Internet. Accordingly, the modules, algorithms, components, etc., for monitoring and remediating thermal failures and for monitoring and remediating battery cell failures at the vehicle as well as any other connected computer systems and their components (e.g., in a control or command center), can create message related data and exchange message related data (e.g., Internet Protocol ("IP") datagrams and other higher layer protocols that utilize IP datagrams, such as, Transmission Control Protocol ("TCP"), Hypertext Transfer Protocol ("HTTP"), Simple Mail Transfer Protocol ("SMTP"), etc. or using other non-datagram protocols) over the network.

As such, monitoring equipment for monitoring a battery pack and/or thermal failure can be operated (e.g., remotely) over the computer network. When a control system (e.g., a remote control system) is used to control a vehicle (whether the vehicle is manned or unmanned), the control system can also be used to control any monitoring equipment components.

In some embodiments, battery packs and/or battery cells and/or thermal failure is monitored though autonomous operation by a robotic vehicle or system. When battery failures are detected, a robotic vehicle or system can implement remediating measures to mitigate or eliminate the chance of dangerous events occurring, such as, for example, thermal failure. When thermal failures are detected, a robotic vehicle or system can also implement remediating measures to mitigate or eliminate the chance of dangerous events escalating (e.g., by venting dangerous gases).

Embodiments of the present invention may comprise or utilize a special purpose or general-purpose computer including computer hardware, such as, for example, one or more processors and system memory, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, embodiments of the invention can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that computer storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the invention can also be implemented in cloud computing environments. In this description and the following claims, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud computing model can be composed of various characteristics such as, for example, on-demand self-service, broad network access, resource pooling, rapid elasticity, measured service, and so forth. A cloud computing model can also expose various service models, such as, for example, Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth. In this description and in the claims, a "cloud computing environment" is an environment in which cloud computing is employed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A container comprising:
   a wall portion including a panel, wherein any part of the panel exposed to sufficient heat crumbles creating an opening in the wall portion; and
   an electrical isolator that electrically isolates a battery cell when part of the panel crumbles.

2. The container of claim 1, wherein any part of the panel exposed to sufficient heat crumbling comprises any part of the panel exposed to sufficient heat crumbling without burning.

3. The container of claim 1, wherein any part of the panel exposed to sufficient heat crumbling comprises any part of a thermos-sensitive panel exposed to sufficient heat crumbling.

4. The container of claim 1, wherein the container comprises a sealed container and wherein a wall portion including a panel comprises the panel sealed to the wall portion.

5. The container of claim 4, further comprising the battery cell contained in the interior of the sealed container; and
   wherein any part of the panel exposed to sufficient heat crumbling comprises any part of the panel exposed to sufficient heat crumbling allowing gases to vent out of the interior of the sealed container.

6. The container of claim 5, wherein the battery cell comprises an unsealed edge oriented to align with the panel.

7. The container of claim 1, further comprising a sensor that alerts a monitoring system when part of the thermo-sensitive panel crumbles.

8. The container of claim 1, wherein a wall portion including a thermo-sensitive panel comprises the wall portion constructed from the thermo-sensitive panel.

9. The container of claim 1, wherein the thermo-sensitive panel includes one or more of: nylon, polyolefin, fluoropolymer, PVC, neoprene, silicone elastomer, celluloid, or cellulose laminate.

10. A container comprising:
    a wall portion including a panel, wherein any part of the panel exposed to sufficient heat ruptures creating a non-resealable opening in the wall portion; and
    an electrical isolator that electrically isolates a battery cell when part of the panel ruptures.

11. The container of claim 10, wherein the container comprises a sealed container and wherein a wall portion including a panel comprises the panel sealed to the wall portion.

12. The container of claim 10, further comprising the battery cell contained in the interior of the sealed container; and
    wherein any part of the panel exposed to sufficient heat rupturing comprises any part of the panel exposed to sufficient heat rupturing allowing gases to vent out of the interior of the sealed container.

13. The container of claim 10, further comprising a sensor that alerts a monitoring system when part of the panel ruptures.

14. The container of claim 10, wherein the panel includes one or more of: nylon, polyolefin, fluoropolymer, PVC, neoprene, silicone elastomer, celluloid, or cellulose laminate.

15. A vehicle, the vehicle comprising:
    a container including a panel in an external wall of the vehicle, wherein any part of the panel exposed to sufficient heat crumbles creating an opening in the external wall of the vehicle; and
    an electrical isolator that electrically isolates a battery cell when part of the panel crumbles.

16. The vehicle of claim 15, wherein the container comprises a sealed container and wherein including a panel in an external wall of the vehicle comprises the panel sealed to the external wall of the vehicle;

further comprising the battery cell contained in the interior of the sealed container; and wherein any part of the panel exposed to sufficient heat crumbling comprises any part of the panel exposed to sufficient heat crumbling allowing gases in the interior of the sealed container to vent outside of the vehicle.

17. The vehicle of claim 16, further comprising a sensor that alerts a monitoring system when part of the panel crumbles.

18. The vehicle of claim 15, wherein the vehicle comprises an Unmanned Aerial Vehicle (UAV).

19. A vehicle comprising:
a container including a panel in an external wall of the vehicle, wherein any part of the panel exposed to sufficient heat ruptures creating a non-resealable opening in the external wall of the vehicle; and
an electrical isolator that electrically isolates a battery cell when part of the panel crumbles.

20. The vehicle of claim 19, wherein the container comprises a sealed container and wherein including a panel in an external wall of the vehicle comprises the panel sealed to the external wall of the vehicle;

further comprising the battery cell contained in the interior of the sealed container; and wherein any part of the panel exposed to sufficient heat rupturing comprises any part of the panel exposed to sufficient heat rupturing allowing gases in the interior of the sealed container to vent outside of the vehicle.

21. The vehicle of claim 20, further comprising a sensor that alerts a monitoring system when part of the panel ruptures.

22. The vehicle of claim 19, wherein the vehicle comprises an Unmanned Aerial Vehicle (UAV).

* * * * *